United States Patent
Childress et al.

(10) Patent No.: US 10,663,537 B2
(45) Date of Patent: May 26, 2020

(54) MAGNETIC SENSOR CELL FOR MEASURING ONE- AND TWO-DIMENSIONAL MAGNETIC FIELDS AND METHOD FOR MEASURING SAID MAGNETIC FIELDS USING THE MAGNETIC SENSOR CELL

(71) Applicant: CROCUS Technology SA, Grenoble (FR)

(72) Inventors: Jeffrey Childress, San Jose, CA (US); Romain Foissac, Grenoble (FR); Kenneth MacKay, Les Sagnes (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 73 days.

(21) Appl. No.: 15/481,805

(22) Filed: Apr. 7, 2017

(65) Prior Publication Data
US 2018/0292473 A1 Oct. 11, 2018

(51) Int. Cl.
*G01R 33/09* (2006.01)
*G01R 33/00* (2006.01)

(52) U.S. Cl.
CPC ....... *G01R 33/098* (2013.01); *G01R 33/0005* (2013.01); *G01R 33/093* (2013.01)

(58) Field of Classification Search
CPC .................................................... G01R 33/09
See application file for complete search history.

(56) References Cited

U.S. PATENT DOCUMENTS

2011/0121826 A1* 5/2011 Engel .................... B82Y 25/00
324/249
2017/0212189 A1* 7/2017 Holm ................... G01R 33/098

FOREIGN PATENT DOCUMENTS

WO WO-2008020817 A1 * 2/2008 ............. G01R 33/09

OTHER PUBLICATIONS

Zeng et al., "Nanoscale magnetic tunnel junction sensors with perpendicular anisotropy sensing layer", 2012, Applied Physics Letters 101 (Year: 2012).*

* cited by examiner

*Primary Examiner* — Patrick Assouad
*Assistant Examiner* — Feba Pothen
(74) *Attorney, Agent, or Firm* — Pearne & Gordon LLP

(57) ABSTRACT

A magnetic sensor cell including a magnetic tunnel junction including a reference layer having a reference magnetization oriented substantially parallel to the plane of the reference layer, a sense layer having a sense magnetization, and a tunnel barrier layer between the sense and reference layers. The sense layer includes an intrinsic anisotropy substantially perpendicular to the plane of the sense layer such that the sense magnetization is orientable between an initial direction perpendicular to the plane of the sense layer and a direction parallel to the plane of the sense layer; the intrinsic anisotropy having in anisotropy field being above 150 Oe.

20 Claims, 3 Drawing Sheets

MAGNETIC SENSOR CELL FOR MEASURING ONE- AND TWO-DIMENSIONAL MAGNETIC FIELDS AND METHOD FOR MEASURING SAID MAGNETIC FIELDS USING THE MAGNETIC SENSOR CELL

FIELD

The present disclosure concerns a magnetic sensor cell having a magnetic tunnel junction that can sense one- and two-dimensional magnetic fields. The present disclosure also pertains to a method for sensing the one- and two-dimensional external magnetic field using the magnetic sensor cell.

DESCRIPTION OF RELATED ART

Self-referenced magnetic tunnel junctions can be used to sense magnetic fields, in magnetic sensors or compasses. Self-referenced magnetic tunnel junctions typically comprise a reference layer having a reference magnetization, a sense layer having a sense magnetization and a tunnel barrier layer between the sense layer and the reference layer. During a sensing operation, an external magnetic field aligns the sense magnetization more parallel or more antiparallel to the reference magnetization.

Ideally, the sense layer should have a linear and non-hysteretic behavior with respect to the applied field, when measured along the pinned reference layer direction. The linear sensing is usually achieved by having the sense magnetization being perpendicular to the reference magnetization. This can be achieved by pinning the reference magnetization perpendicular to the anisotropy axis of the sense layer. The anisotropy axis of the sense layer lies parallel to the plane of the sense and reference layers.

When an external field is applied, self-referenced magnetic tunnel junctions thus allow for measuring the component of the magnetic field along the magnetization axis of the reference layers. By utilizing two junctions, or two arrays of junctions found in MLU devices, i.e. two arrays of self-referenced magnetic tunnel junctions, with reference layers oriented 90 degrees from each other, the two components of the magnetic field in the plane of the two reference layers can be measured.

SUMMARY

The present disclosure concerns a magnetic sensor cell comprising a magnetic tunnel junction comprising a reference layer having a reference magnetization oriented substantially parallel to the plane of the reference layer, a sense layer having a sense magnetization, and a tunnel barrier layer between the sense and reference layers; the sense layer comprising an intrinsic anisotropy being substantially perpendicular to the plane of the sense layer such that the sense magnetization is orientable between an initial direction perpendicular to the plane of the sense layer and a direction parallel to the plane of the sense layer; the intrinsic anisotropy having in anisotropy field being above 150 Oe.

The present disclosure further concerns a method for sensing a one-dimensional and two-dimensional external magnetic field using the magnetic sensor cell; the method comprising:

pinning the reference magnetization such that it does not move in the external magnetic field;

subjecting the magnetic sensor cell to the external magnetic field; and measuring a resistance of the magnetic sensor cell.

An advantage of the magnetic sensor cell is that the sense magnetization is always aligned perpendicular to the reference magnetization in the absence of magnetic field.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
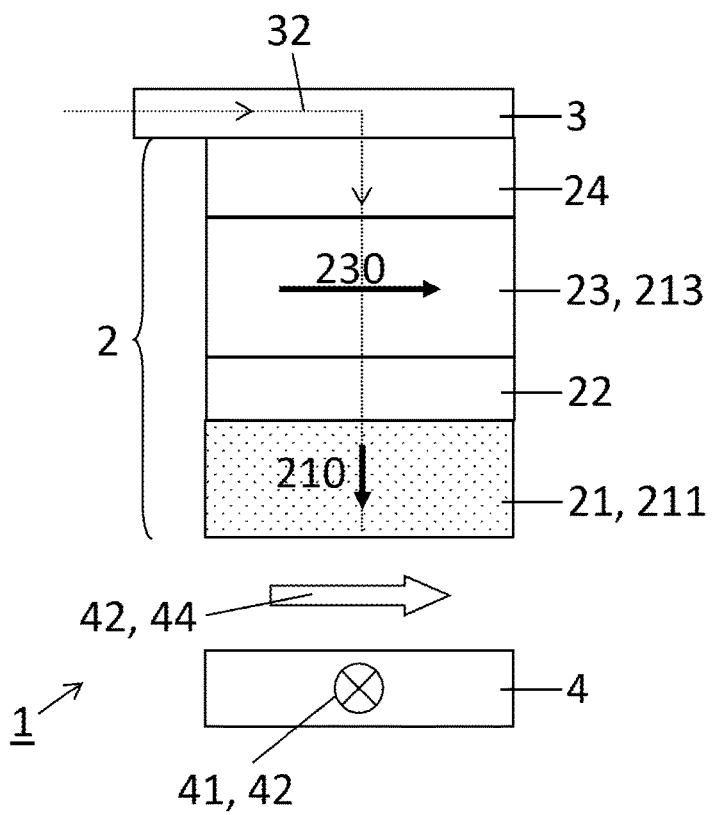
FIG. 1(a) represents a cross section view and FIG. 1(b) represents a top view of a magnetic sensor cell comprising a magnetic tunnel junction with a sense layer having a sense magnetization, according to an embodiment.
Figure 1:
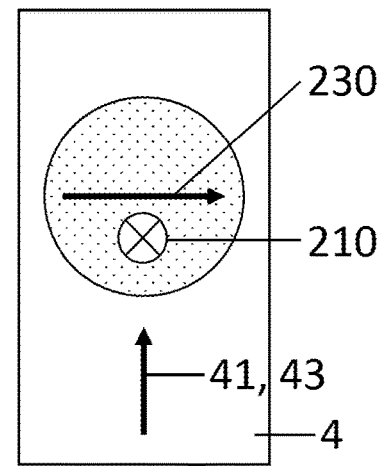

FIG. 1 represents a cross section view (FIG. 1a) and a top view (FIG. 1b) of a magnetic sensor cell 1 according to an embodiment. The magnetic sensor cell 1 comprises a magnetic tunnel junction 2 including a reference layer 23 having a reference magnetization 230, a sense layer 21 having a sense magnetization 210 and a tunnel barrier layer 22 between the sense layer 21 and the reference layer 23. A current line 3 is in electrical contact with one extremity of the magnetic tunnel junction 2. The magnetic sensor cell 1 further comprises a field line 4 adapted for passing a sense field current 41 or a reference field current 43 such as to generate, respectively, a sense magnetic field 42 and a reference magnetic field 44. The reference magnetization 230 and the sense magnetization 210 can be oriented substantially parallel to the plane of the reference and sense layers 21, 23.

In an embodiment, the sense layer 21 comprises an out-of-plane intrinsic anisotropy. The intrinsic anisotropy is oriented substantially perpendicularly to the plane of the sense layer 21. The anisotropy field represents the approximate magnetic field required to overcome this anisotropy and orient the sense magnetization 210 in the plane of the sense layer 21.

Preferably, the out-of-plane intrinsic anisotropy of the sense layer 21 has an anisotropy field that is above 150 Oe. More generally, the anisotropy field should be greater than the minimal magnitude of an external magnetic field required for rotating (or switching) the sense magnetization 210. Thus, the anisotropy field depends on the application, i.e., the magnitude of the external magnetic field to be sensed. For example, the anisotropy field can be above 160 Oe, or above 180 Oe.

In an embodiment, in the absence of a magnetic field, the sense magnetization 210 is initially oriented substantially out-of-plane (see FIG. 1). In this configuration, the sense magnetization 210 is orientable between its initial out-of-plane direction and a direction substantially parallel to the plane of the sense layer 21 (in-plane) when an external magnetic field 45 is applied in a direction in-plane.

The linear sensing is usually achieved by having the sense magnetization 210 being perpendicular to the reference magnetization 230. This can be achieved by pinning the reference magnetization 230 perpendicular to the anisotropy axis of the sense layer 21. The anisotropy axis of the sense layer 21 lies parallel to the plane of the sense and reference layers 21, 23.

In an embodiment, the sense layer 21 comprises a ferromagnetic layer 211 comprising a $Co_xFe_yB_z$ alloy.

Thickness of the sense layer 21 can be varied in order to change the net perpendicular anisotropy value, i.e., the magnitude of the anisotropy field. The sense layer 21 can have a thickness between 0.5 nm and 2 nm.

Preferably the ferromagnetic layer 211 comprises a $Co_{20}Fe_{60}B_{20}$ alloy, wherein the content is in at %. A thickness of the sense layer 21 of about 1.5 nm then yields a anisotropy field above 150 Oe, or above 160 Oe, or above 180 Oe.

Figure 2:
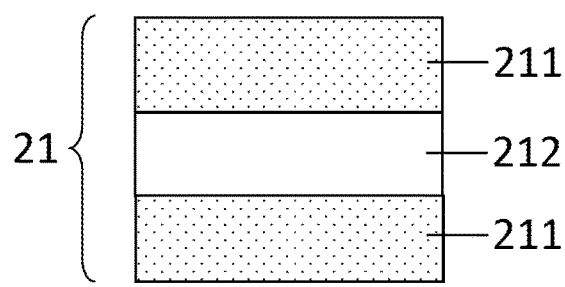
FIG. 2 shows the sense layer according, to an embodiment.

In a variant illustrated in FIG. 2, the sense layer 21 comprises a multilayer configuration comprising at least the ferromagnetic layer 211 and a non-magnetic layer 212. The non-magnetic layer 212 can comprise any one or a combination of these elements: Ta, W, Mo, Nb, Zr, Ti, MgO, Hf. The non-magnetic layer 212 can promote perpendicular anisotropy at CoFeB interfaces of the sense layer 21.

In this configuration, each of the non-magnetic layer 212 can have a thickness comprised between 0.1 nm and 0.4 nm.

The reference layer 23 can comprise one or a plurality of ferromagnetic layers 213, each ferromagnetic layer 213 comprising Co, Fe, Ni, CoFeB or their alloys. The reference layer 23 can further comprise a synthetic antiferromagnet (SAF) comprising at least two of the ferromagnetic layer 213, two ferromagnetic layers 213 being separated by an antiparallel coupling layer comprising of: Ru, Ir or Cu or a combination of these elements. In an exemplary embodiment, the reference layer 23 comprises the following arrangement: CoFe(2.5 nm)/Ru(0.8 nm)/CoFe(1 nm)/CoFeB(2 nm).

The tunnel barrier 22 can comprise, or be formed of, an insulating material. Suitable insulating materials include oxides, such as aluminum oxide (e.g., Al2O3) and magnesium oxide (e.g., MgO). The oxidation state of the oxide can be adjusted to increase the perpendicular anisotropy field of the sense layer 21. A thickness of the tunnel barrier layer 22 can be in the nm range, such as from about 1 nm to about 3 nm. An optimal thickness of the tunnel barrier 22 can achieves both perpendicular anisotropy field above 150 Oe, or above 160 Oe, or above 180 Oe, while providing a tunnel magnetoresistance (TMR) of the magnetic tunnel junction 2 being higher than 50% preferably 100%. An optimal thickness of the tunnel barrier 22 can be obtained by inserting a plurality (double or multilayer) of MgO (or another suitable oxide or insulating material) layers.

In a preferred embodiment, the insulating materials is MgO and the thickness is about 1 nm.

In another variant not represented, another insulating material layer is added in direct contact with the sense layer 21, on the side of the sense layer 21 opposed to the one in contact with the tunnel barrier layer 22. This additional insulating material layer allows for increasing the anisotropy field and thus allowing for thicker sense layer 21 while keeping high enough anisotropy field. Thicker sense layer 21 allows for obtaining a more robust magnetic layer and signal-noise ratio improvement of the magnetic sensor cell 1. The additional insulating material layer is preferably a MgO layer.

Using the additional insulating material layer allows the sense layer to have a thickness between 1 to 3 nm, for example, 2 nm.

In normal operating conditions of the magnetic sensor cell 1, the reference magnetization 230 is fixed in the presence of an external magnetic field 45 while the sense magnetization 210 can be aligned in that field.

To that end, the magnetic sensor cell 1 can comprise an antiferromagnetic layer 24 exchange coupling the reference layer 23 such as to pin the reference magnetization 230 at a low temperature threshold $T_L$ and free it at a high temperature threshold $T_H$.

Suitable materials for the antiferromagnetic layer 24 include transition metals and their alloys. For example, suitable antiferromagnetic materials include alloys based on manganese (Mn), such as alloys based on iridium (Ir) and Mn (e.g., IrMn); alloys based on Fe and Mn (e.g., FeMn); alloys based on platinum (Pt) and Mn (e.g., PtMn); and alloys based on Ni and Mn (e.g., NiMn). In some instances, the high temperature threshold $T_H$, of alloys based on Ir and Mn (or based on Fe and Mn) can be in the range of about 120° C. to about 220° C. or about 150° C. to about 200° C., such as about 200° C., and can be smaller than the high temperature threshold $T_H$ of alloys based on Pt and Mn (or based on Ni and Mn), which can be in the range of about 300° C. to about 350° C. Suitable materials for the antiferromagnetic layer 24 can further include oxide layers, such as NiO.

In a preferred embodiment, the antiferromagnetic layer 24 comprises a IrMn layer having of about 10 nm in thickness.

In an embodiment, the magnetic tunnel junction 2 comprises, in this order, a Si substrate, an underlayer, the antiferromagnetic layer 24, the reference layer 23, the tunnel barrier layer 22, the sense layer 21 and at least a cap layer.

The underlayer can comprise a multilayer comprising one or more of: Ta, TaN, Ti, TiN, W, Cu, CuN, Ru, Cr, NiFe, Pt, Nb, Mo, Ir. In a possible embodiment, the underlayer comprises the following arrangement: Ta(5 nm)/Ru(2 nm).

The magnetic sensor cell 1 can be programmed by switching the reference magnetization 230 in a predetermined direction in the plane of the reference layer 23 (see FIG. 1b). The programming operation can be thermally assisted wherein the programming operation further comprises a step of heating the magnetic tunnel junction 2 to the high temperature threshold $T_H$ by passing a heating current 31 in the magnetic tunnel junction 2 via the current line 3. The reference magnetization 230 is then switched by applying the reference magnetic field 44. After switching the reference magnetization 230, the magnetic tunnel junction 2 can be cooled to the low temperature threshold such as to pin the reference magnetization 230 in the switched state. The reference magnetic field 44 is generated by passing the reference field current 43 in the field line 4 with a direction being determined by the polarity of the reference field current 43.

Figure 3:
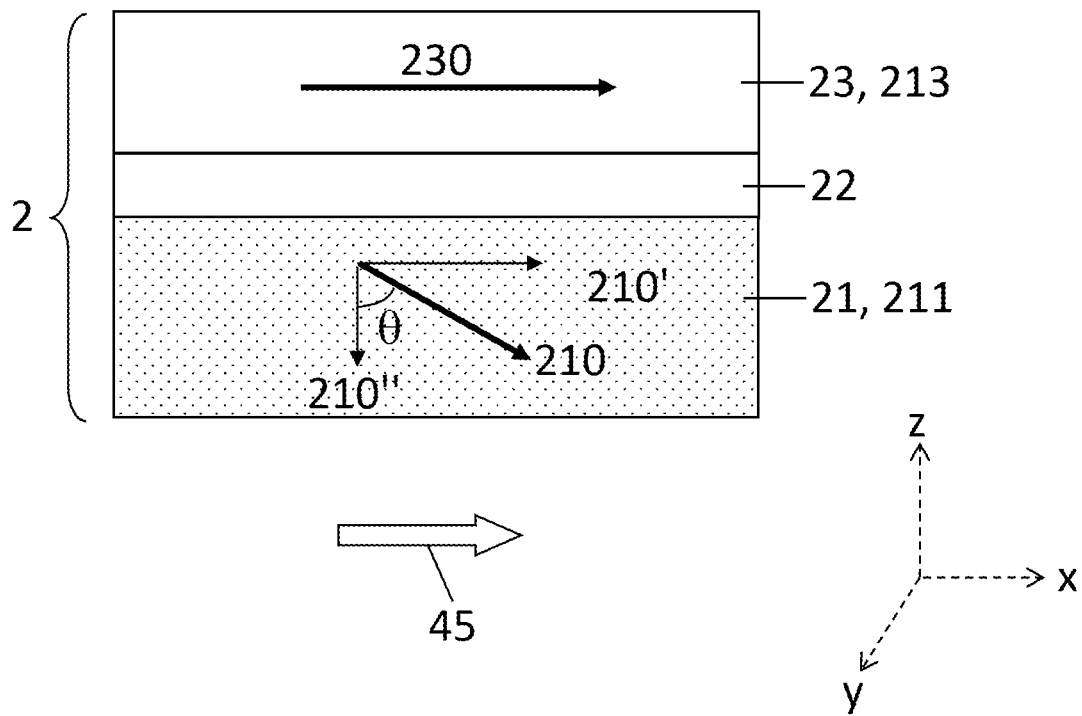
FIG. 3 illustrates an enlarged portion of the magnetic tunnel junction, according to an embodiment.

FIG. 3 illustrates an enlarged portion of the magnetic tunnel junction 2 of the magnetic sensor cell 1 of FIG. 1, showing the reference layer 23, tunnel barrier layer 22 and sense layer 21, in the presence of an external magnetic field 45 that is oriented in-plane. Also shown in FIG. 3 is x, y, z coordinates, wherein the x, y coordinates are in-plane, i.e., in the plane of the sense layer 21 (and of the reference layer 23).

Depending on its magnitude, the in-plane external magnetic field 45 (or an in-plane component of an external magnetic field) deflects the sense magnetization 210 from its initial orientation out-of-plane to a deflected orientation at an angle θ between the 0° (out-of-plane) to 90° (in-plane). For a non-zero angle smaller than 90°, the sense magnetization 210 comprises an in-plane component 210' and an out-of-plane component 210". For an angle of than 90°, the sense magnetization 210 comprises only an in-plane component 210'.

In an embodiment, sensing the magnitude of the in-plane external magnetic field 45 with magnetic sensor cell 1 can be performed by measuring a resistance R of the magnetic tunnel junction 2 when the sense magnetization 210 is deflected by the in-plane external magnetic field 45.

Measuring a resistance R of the magnetic tunnel junction 2 can be performed by passing a sense current 32 in the magnetic tunnel junction 2 via the current line 3. The measured a resistance R is proportional to the relative magnitude of the reference magnetization 230 and the in-plane component 210' of the sense magnetization 210. The measured a resistance R is also proportional to the orientation, in the plane of the sense layer (and reference layer), of the in-plane component 210' of the sense magnetization 210 relative to the reference magnetization 230.

Figure 4:
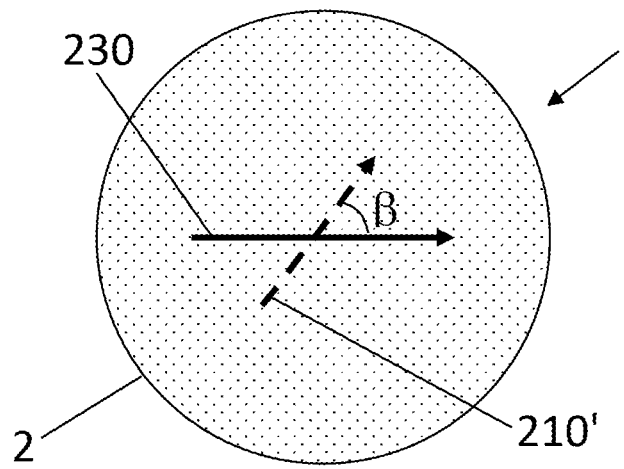
FIG. 4(a) shows a top view of the magnetic tunnel junction and FIG. 4(b) illustrates the in-plane external magnetic field, according to an embodiment.
Figure 4:
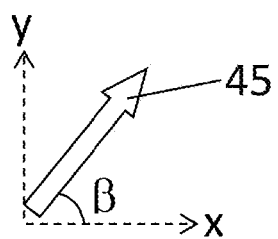

FIG. 4a shows a top view of the magnetic tunnel junction 2 where the reference magnetization 230 and the in-plane component 210' of the sense magnetization 210 are visible. In particular, FIG. 4 illustrates the case where the in-plane external magnetic field 45 is oriented at an angle β relative to the orientation of the reference magnetization 230 (see FIG. 4b).

The magnetic sensor cell 1 disclosed herein can thus be used for sensing (or measuring) the magnitude of the component along the reference-layer axis, i.e., along the plane of the reference layer 23, of an in-plane external magnetic field 45 oriented in-plane (one-dimensional, or 1D, applications).

Figure 5:
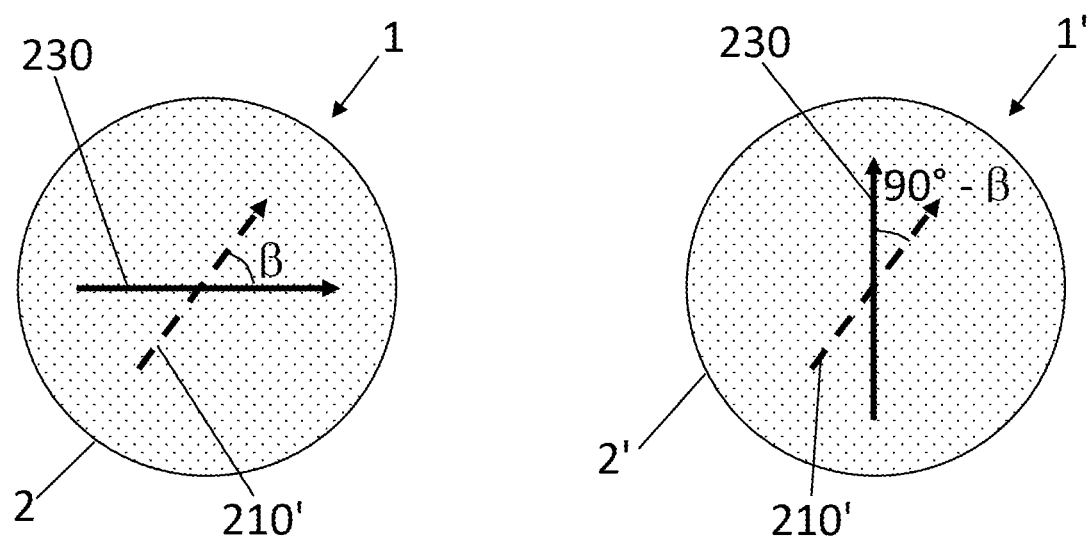
FIG. 5(a) shows a top view of two magnetic tunnel junctions and FIG. 5(b) shows the in-plane external magnetic field.
Figure 5:
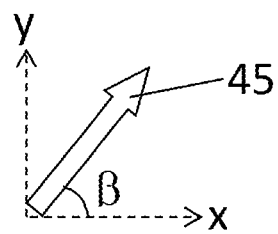

In an embodiment represented in FIG. 5, the magnetic sensor cell 1 comprises two magnetic tunnel junctions 2, wherein the storage magnetization 230 of one of the magnetic tunnel junctions 2 is aligned substantially at 90° relative to the storage magnetization 230 of the other magnetic tunnel junction 2. FIG. 5a shows a top view of the two magnetic tunnel junctions 2 and FIG. 5b shows the in-plane external magnetic field 45 oriented at an angle β to the orientation of the reference magnetization 230 of one of the magnetic tunnel junctions 2 (and at an angle 90°−β to the orientation of the reference magnetization 230 of the other magnetic tunnel junction 2). By using two separate magnetic tunnel junctions 2 with reference layer axes oriented 90-degrees from each other, the two orthogonal in-plane components of the external magnetic field 45 can be measured for sensing the in-plane orientation β of the in-plane external magnetic field 45 (two-dimensional, or 2D, applications).

Here one-dimensional and two-dimensional refer to an external magnetic field 45 being oriented along, respectively one and two dimensions in a Cartesian coordinate system.

More generally, the magnetic sensor cell 1 can comprise a first array and a second array, each array comprising a plurality of the magnetic tunnel junction 2 (not shown). The magnetic tunnel junctions 2 of the first array and the magnetic tunnel junctions 2 of the second array can have their respective (pinned) storage magnetization 230 aligned substantially at 90° from each other.

Sensing the two orthogonal in-plane components of the external magnetic field 45 can be performed by measuring the resistance R of each of the first and second array.

The in-plane component 210' of the sense magnetization 210 sense layer 21 having a strong perpendicular anisotropy has a very small (near-zero) coercivity and very small in-plane anisotropy. The in-plane component 210' has a good linearity and non-hysteretic behavior over a wide magnitude range of the in-plane external field 45. The magnetic sensor cell 1 disclosed herein is thus advantageous over conventional magnetic sensor cells for sensing an in-plane external field 45 and for 1D and 2D angular applications.

REFERENCE NUMBERS AND SYMBOLS 1 magnetic sensor cell
2 magnetic tunnel junction
21 sense layer
210 sense magnetization
210' in-plane component of the sense magnetization
210" out-of-plane component of the sense magnetization
211 ferromagnetic layer
212 non-magnetic layer
22 tunnel barrier layer
23 reference layer
230 reference magnetization
24 antiferromagnetic layer
3 current line
31 heating current
32 sense current
4 field line
41 sense field current
43 sense magnetic field
43 reference field current
44 reference magnetic field
45 external magnetic field
R resistance of the magnetic tunnel junction
θ angle
β angle

The invention claimed is:

1. A magnetic sensor cell comprising:
a magnetic tunnel junction comprising a reference layer having a reference magnetization oriented substantially parallel to a plane of the reference layer, a sense layer having a sense magnetization, and a tunnel barrier layer between the sense and reference layers, wherein:
the sense layer comprising an intrinsic anisotropy being substantially perpendicular to a plane of the sense layer such that the sense magnetization is orientable from an initial direction perpendicular to the plane of the sense layer to a direction parallel to the plane of the sense layer,
wherein the intrinsic anisotropy has an anisotropy field above 150 Oe.

2. The magnetic sensor cell according to claim 1, wherein the sense layer comprises a ferromagnetic layer comprising a $Co_xFe_yB_z$ alloy.

3. The magnetic sensor cell according to claim 2, wherein the ferromagnetic layer comprises $Co_{20}Fe_{60}B_{20}$.

4. The magnetic sensor cell according to claim 2, wherein the ferromagnetic layer has a thickness between 0.5 nm and 2 nm.

5. The magnetic sensor cell according to claim 4, wherein the ferromagnetic layer has a thickness of 1.5 nm.

6. The magnetic sensor cell according to claim 2, wherein the sense layer comprises a multilayer configuration comprising at least the ferromagnetic layer and a non-magnetic layer.

7. The magnetic sensor cell according to claim 6, wherein the non-magnetic layer comprises any one or a combination of these elements: Ta, W, Mo, Nb, Zr, Ti, MgO, Hf.

8. The magnetic sensor cell according to claim 6, wherein the non-magnetic layer has a thickness between 0.1 nm and 0.4 nm.

9. The magnetic sensor cell according to claim 1, wherein the tunnel barrier layer comprises an insulating material including MgO, and the tunnel barrier layer has a thickness of about 1 nm.

10. The magnetic sensor cell according to claim 1, comprising a first array and a second array, each array comprising a plurality of the magnetic tunnel junction, wherein the magnetic tunnel junctions of the first array and the magnetic tunnel junctions of the second array have their storage magnetization aligned substantially at 90° from each other.

11. A method for sensing a one-dimensional and two-dimensional external magnetic field using a magnetic sensor cell comprising a magnetic tunnel junction comprising a reference layer having a reference magnetization oriented substantially parallel to a plane of the reference layer, a sense layer having a sense magnetization, and a tunnel barrier layer between the sense and reference layers, wherein the sense layer comprises an intrinsic anisotropy being substantially perpendicular to a plane of the sense layer such that the sense magnetization is orientable from an initial direction perpendicular to the plane of the sense layer to a direction parallel to the plane of the sense layer, the intrinsic anisotropy has an anisotropy field above 150 Oe, and the sense magnetization is initially oriented perpendicular to the plane of the sense layer; the method comprising:
- pinning the reference magnetization such that it does not move in the external magnetic field;
- subjecting the magnetic sensor cell to the external magnetic field; and
- measuring a resistance of the magnetic sensor cell.

12. The method according to claim 11, wherein said measuring a resistance is performed by passing a sense current in the magnetic tunnel junction.

13. The method according to claim 11, wherein the resistance is proportional to a component of the sense magnetization being oriented parallel to the plane of the sense layer.

14. The method according to claim 11, wherein the resistance is proportional to an angle between a component of the sense magnetization being oriented parallel to the plane of the sense layer relative to the orientation of the reference magnetization.

15. The method according to claim 11, wherein comprising a first array and a second array, each array comprising a plurality of the magnetic tunnel junction, wherein the magnetic tunnel junctions of the first array and the magnetic tunnel junctions of the second array have their storage magnetization aligned substantially at 90° from each other; and wherein the method comprises measuring the two orthogonal in-plane components of the external magnetic field by measuring a resistance of each of the first and second array.

16. Magnetic sensor cell comprising:
a magnetic tunnel junction comprising a reference layer having a reference magnetization oriented substantially parallel to a plane of the reference layer, a sense layer having a sense magnetization, and a tunnel barrier layer between the sense and reference layers, wherein:
the sense layer comprises an intrinsic anisotropy being substantially perpendicular to a plane of the sense layer such that the sense magnetization is orientable from an initial direction perpendicular to the plane of the sense layer to a direction parallel to the plane of the sense layer,
the intrinsic anisotropy has an anisotropy field above 150 Oe, and
the magnetic tunnel junction is configured to sense a magnitude of the external magnetic field along the plane of the reference layer, from the relative magnitude and orientation of the reference magnetization and the component of the sense magnetization parallel to the plane of the sense layer.

17. The magnetic sensor cell according to claim 1, wherein a thickness of the tunnel barrier layer is between 1 nm and 3 nm, such that a tunnel magnetoresistance of the magnetic tunnel junction is greater than 50%.

18. The method according to claim 11, wherein a thickness of the tunnel barrier layer is between 1 nm and 3 nm, such that a tunnel magnetoresistance of the magnetic tunnel junction is greater than 50%.

19. The magnetic sensor cell according to claim 16, wherein a thickness of the tunnel barrier layer is between 1 nm and 3 nm, such that a tunnel magnetoresistance of the magnetic tunnel junction is greater than 50%.

20. The method according to claim 11, wherein the measured resistance is proportional to the relative magnitude of the sense magnetization component parallel to the plane of the sense layer.

* * * * *